(12) United States Patent
Nie (10) Patent No.: US 10,340,323 B2
(45) Date of Patent: Jul. 2, 2019

(54) DOUBLE-SIDED OLED DISPLAY DEVICE (71) Applicant: Shenzhen China Star Optoelectronics Semiconductor Display Technology Co., Ltd., Shenzhen (CN)

(72) Inventor: Chenglei Nie, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 23 days.

(21) Appl. No.: 15/563,613

(22) PCT Filed: Aug. 18, 2017

(86) PCT No.: PCT/CN2017/098170
§ 371 (c)(1),
(2) Date: Oct. 1, 2017

(87) PCT Pub. No.: WO2019/006831
PCT Pub. Date: Jan. 10, 2019

(65) Prior Publication Data
US 2019/0013377 A1 Jan. 10, 2019

(30) Foreign Application Priority Data

Jul. 4, 2017 (CN) .......................... 2017 1 0539585

(51) Int. Cl.
*H01L 27/32* (2006.01)
*H01L 51/52* (2006.01)
(Continued)

(52) U.S. Cl.
CPC ....... *H01L 27/3267* (2013.01); *G09G 3/3225* (2013.01); *H01L 27/3211* (2013.01);
(Continued)

(58) Field of Classification Search
CPC ............ H01L 27/3267; H01L 27/3211; H01L 27/3246; H01L 27/3262; H01L 51/5012; H01L 51/5206; H01L 51/5234
(Continued)

(56) References Cited

U.S. PATENT DOCUMENTS

2004/0113545 A1* 6/2004 Pang ................... H01L 27/3246
313/504
2004/0245531 A1* 12/2004 Fuii ..................... H01L 27/3267
257/88
(Continued)

FOREIGN PATENT DOCUMENTS

| CN | 103227186 A | 7/2013 |
|---|---|---|
| CN | 103633114 A | 3/2014 |

(Continued)

*Primary Examiner* — Sheikh Maruf
(74) *Attorney, Agent, or Firm* — Leong C. Lei (57) ABSTRACT

The present invention provides a double-sided OLED display device, in which two adjacent ones of displaying sections (A) are arranged such that OLEDs of all the pixels (P) located in one of the displaying sections (A) are top-emission OLEDs (D), while the OLEDs of all the pixels (P) located in another one of the displaying sections (A) are bottom-emission OLEDs (D'). A user is allowed to observe normal displaying of images in two opposite directions associated with the front and rear sides of one OLED display device and there is no need to combine two display devices in a back-to-back manner to provide double-sided displaying so that the application range of the OLED display device can be widened, the amount of space occupied by the double-sided display device can be reduced, and aesthetics of the double-sided display devices can be greatly improved.

16 Claims, 3 Drawing Sheets (51) Int. Cl.
　　　*G09G 3/3225*　　(2016.01)
　　　*H01L 51/50*　　(2006.01)
(52) U.S. Cl.
　　　CPC ...... *H01L 27/3246* (2013.01); *H01L 27/3248* (2013.01); *H01L 27/3262* (2013.01); *H01L 51/5012* (2013.01); H01L 51/5206 (2013.01); H01L 51/5234 (2013.01); H01L 51/5281 (2013.01); H01L 2251/5323 (2013.01)
(58) Field of Classification Search
　　　USPC ........................................................ 257/40
　　　See application file for complete search history.

(56) References Cited

U.S. PATENT DOCUMENTS

| | | | | |
|---|---|---|---|---|
| 2004/0263056 | A1* | 12/2004 | Seo | G09G 3/3216 313/500 |
| 2004/0263425 | A1* | 12/2004 | Anzai | G06F 1/32 345/1.1 |
| 2005/0151830 | A1* | 7/2005 | Yamazaki | G09G 3/20 347/238 |
| 2006/0038752 | A1* | 2/2006 | Winters | G09G 3/3225 345/76 |
| 2007/0045620 | A1* | 3/2007 | Park | G09G 3/3233 257/40 |
| 2011/0148944 | A1* | 6/2011 | Kobayashi | G09G 3/3225 345/690 |
| 2012/0146065 | A1* | 6/2012 | Fujii | H01L 27/3267 257/88 |
| 2015/0048335 | A1* | 2/2015 | Chung | H01L 27/3267 257/40 |
| 2015/0076456 | A1 | 3/2015 | Choi et al. | |
| 2015/0079710 | A1* | 3/2015 | Kim | H01L 51/56 438/29 |
| 2015/0123084 | A1* | 5/2015 | Kim | H01L 27/326 257/40 |
| 2015/0221895 | A1* | 8/2015 | Sato | H01L 27/3211 257/40 |
| 2015/0357593 | A1* | 12/2015 | Gunji | H01L 51/5092 257/40 |
| 2015/0372063 | A1* | 12/2015 | Lee | H01L 27/3246 257/40 |
| 2016/0103649 | A1* | 4/2016 | Yoshitani | G06F 3/1446 345/694 |
| 2016/0154259 | A1* | 6/2016 | Kim | G02F 1/137 257/40 |
| 2016/0163992 | A1* | 6/2016 | Bae | H01L 51/0058 257/40 |
| 2016/0181563 | A1* | 6/2016 | Cho | H01L 51/5024 257/40 |
| 2016/0197131 | A1* | 7/2016 | Park | H01L 27/3267 349/139 |

FOREIGN PATENT DOCUMENTS

| | | |
|---|---|---|
| CN | 105226069 A | 1/2016 |
| CN | 106206665 A | 12/2016 |
| CN | 106783913 A | 5/2017 |

\* cited by examiner

DOUBLE-SIDED OLED DISPLAY DEVICE

BACKGROUND OF THE INVENTION

1. Field of the Invention

The present invention relates to the field of display technology, and more particular to a double-sided organic light-emitting diode (OLED) display device.

2. The Related Arts

In the field of display technology, flat panel displays, such as liquid crystal displays (LCDs) and organic light-emitting diode (OLED) displays, have gradually taken the place of cathode ray tube (CRT) displays.

The LCD shows various advantages, such as thin device body, low power consumption, and been free of radiations, and has been widely used in various applications, such as liquid crystal televisions, mobile phones, digital cameras, tablet computers, and display screens of notebook computers.

The OLED display has various features, such as being self-luminous, high brightness, fast response, wide view angle, low power consumption, and being capable of flexible displaying and is considered "dream displays" that has attracted the attention of major display manufacturers and is becoming a main stream of the third-generation displays in the field of display technology.

Heretofore, the LCD and OLED display are generally single-sided displays. Taking a contemporary OLED display as an example, there are generally several different types, including top emission, bottom emission, and transparent display, among which the top-emission OLED display and the bottom-emission OLED display are capable of only single side displaying, while the transparent OLED display, although allowing a user to observe images from opposite directions of the front and rear sides of the OLED display, is only capable of providing a normally displayed image from one direction, while the image observed on the opposite direction is display in a reversed way, so that no double-sized normal displaying can be achieved.

For contemporary LCDs, being constrained to the displaying principle of the LCD, only single-sided displaying or transparent displaying is possible.

With the diversification of styles of electronic products, double-sided displaying is becomes a new feature of the next generation of display devices, particularly for display devices for applications in shop exhibition or outdoors displaying. However, double-sided display devices that are currently available are simply structured by combined two independent single-sided display devices in a back-to-back manner in order to display on two opposite sides. The combined structure is bulky and not beautiful, requires a high manufacturing cost, and does not meet the demand of general consumers for lightweight, compactness, and high cost-to-performance ratio.

SUMMARY OF THE INVENTION

An objective of the present invention are to provide a double-sided organic light-emitting diode (OLED) display device, which provides displaying on two sides with one display so as to reduce costs of installation and maintenance, reduce the amount of space occupied by displays, and helps improve aesthetics.

To achieve the above objective, the present invention provides an OLED display device, which comprises a plurality of pixels arranged in an array, each of the pixels comprising a plurality of sub-pixels that are arranged in sequence, each of the sub-pixels comprising an OLED;

wherein the pixels located in one row of the array or the pixels located in one column of the array collectively form a displaying section, and for two adjacent ones of the displaying sections, the OLEDs of the pixels of one of the displaying sections are top-emission OLEDs, and the OLEDs of the pixels of the other one of the displaying sections are bottom-emission OLEDs.

Optionally, the OLEDs of the pixels of odd rows are top-emission OLEDs and the OLEDs of the pixels of even rows are bottom-emission OLEDs.

Optionally, the OLEDs of the pixels of even rows are top-emission OLEDs and the OLEDs of the pixels of odd rows are bottom-emission OLEDs.

Optionally, the OLEDs of the pixels of odd columns are top-emission OLEDs and the OLEDs of the pixels of even columns are bottom-emission OLEDs.

Optionally, the OLEDs of the pixels of even columns are top-emission OLEDs and the OLEDs of the pixels of odd columns are bottom-emission OLEDs.

The top-emission OLED comprises a first anode, a first OLED emissive layer arranged on the first anode, and a transparent cathode set on and covering the first OLED emissive layer; and the bottom-emission OLED comprises a second anode, a second OLED emissive layer arranged on the second anode, and a non-transparent cathode set on and covering the second OLED emissive layer.

The transparent cathode further covers the non-transparent cathode.

The double-sided OLED display device further comprises a thin-film transistor (TFT) backplate, a pixel definition layer arranged on the TFT backplate, and a polarizer attached to an undersurface of the TFT backplate; and the pixel definition layer comprises a first pixel definition hole and a second pixel definition hole, the top-emission OLED being received in the first pixel definition hole and arranged on the TFT backplate, the bottom-emission OLED being received in the second pixel definition hole and arranged on the TFT backplate; and a portion of the TFT backplate that corresponds to the second OLED emissive layer is transparent and light transmitting.

The TFT backplate comprises:

a backing plate;

a first metal layer that is arranged on the backing plate and is patterned, wherein the patterned first metal layer comprises a first gate electrode, a first lower electrode plate, a second gate electrode, and a second lower electrode plate that are spaced from each other;

a gate insulation layer that is arranged on the backing plate and covers the first gate electrode and the second gate electrode and fills up spacing gaps among the first gate electrode, the first lower electrode plate, the second gate electrode, and the second lower electrode plate;

a first semiconductor active layer that is arranged on the gate insulation layer and located exactly above the first gate electrode;

a second semiconductor active layer that is arranged on the gate insulation layer and located exactly above the second gate electrode;

an etch stop layer that is set on and covers the first semiconductor active layer, the second semiconductor active layer, the gate insulation layer, the first lower electrode plate, and the second lower electrode plate;

a second metal layer that is arranged on the etch stop layer and is patterned, wherein the patterned second metal layer comprises a first source electrode, a first drain electrode, a first upper electrode plate, a second source electrode, a second drain electrode, and a second upper electrode plate that are spaced from each other;

a protective layer that is set on and covers the second metal layer and the etch stop layer; and an organic planarization layer that is set on and covers the protective layer, wherein the first gate electrode, the first semiconductor active layer, the first source electrode, and the first drain electrode collectively form a first drive TFT, and the first lower electrode plate and the first upper electrode plate collectively form a first capacitor; the first source electrode and the first drain electrode are respectively connected, through a first via and second via that extend through the etch stop layer, to two ends of the first semiconductor active layer and the first source electrode is further connected, through a third via that extends through the etch stop layer, to the first lower electrode plate; and the first anode is connected, through a fourth via that extends through the organic planarization layer and the protective layer, to the first upper electrode plate; and the second gate electrode, the second semiconductor active layer, the second source electrode, and the second drain electrode collectively form a second drive TFT, and the second lower electrode plate and the second upper electrode plate collectively form a second capacitor, the second source electrode and the second drain electrode are respectively connected, through a fifth via and a sixth via that extend through the etch stop layer, to two ends of the second semiconductor active layer and the second source electrode is further connected, through a seventh via that extends through the etch stop layer, to the second lower electrode plate; and the second anode is connected, through an eighth via that extends through the organic planarization layer and the protective layer, to the second upper electrode plate.

The first anode and the second anode are each formed of a material composing indium tin oxides; the transparent cathode is formed of a material comprising a magnesium and silver alloy and the non-transparent cathode is formed of a material comprising aluminum.

The present invention also provides an OLED display device, which comprises a plurality of pixels arranged in an array, each of the pixels comprising a plurality of sub-pixels that are arranged in sequence, each of the sub-pixels comprising an OLED;

wherein the pixels located in one row of the array or the pixels located in one column of the array collectively form a displaying section, and for two adjacent ones of the displaying sections, the OLEDs of the pixels of one of the displaying sections are top-emission OLEDs, and the OLEDs of the pixels of the other one of the displaying sections are bottom-emission OLEDs;

wherein the top-emission OLED comprises a first anode, a first OLED emissive layer arranged on the first anode, and a transparent cathode set on and covering the first OLED emissive layer; and the bottom-emission OLED comprises a second anode, a second OLED emissive layer arranged on the second anode, and a non-transparent cathode set on and covering the second OLED emissive layer;

and further comprising a thin-film transistor (TFT) backplate, a pixel definition layer arranged on the TFT backplate, and a polarizer attached to an undersurface of the TFT backplate; and the pixel definition layer comprises a first pixel definition hole and a second pixel definition hole, the top-emission OLED being received in the first pixel definition hole and arranged on the TFT backplate, the bottom-emission OLED being received in the second pixel definition hole and arranged on the TFT backplate; and a portion of the TFT backplate that corresponds to the second OLED emissive layer is transparent and light transmitting.

The efficacy of the present invention is that the present invention provides a double-sided OLED display device, in which two adjacent ones of displaying sections are arranged such that OLEDs of all the pixels located in one of the displaying sections are top-emission OLEDs, while the OLEDs of all the pixels located in another one of the displaying sections are bottom-emission OLEDs. A user is allowed to observe normal displaying of images in two opposite directions associated with the front and rear sides of one OLED display device and there is no need to combine two display devices in a back-to-back manner to provide double-sided displaying so that the application range of the OLED display device can be widened, the amount of space occupied by the double-sided display device can be reduced, and aesthetics of the double-sided display devices can be greatly improved.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
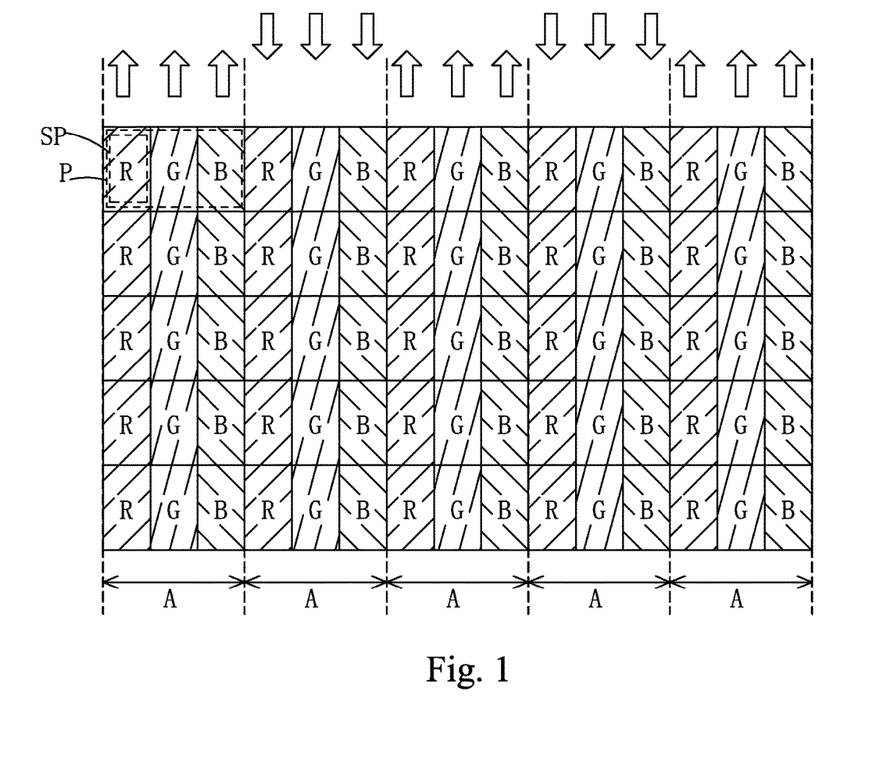
FIG. 1 is a schematic view illustrating directions of light emission of a double-sided organic light-emitting diode (OLED) display device according to an embodiment of the present invention.
Figure 2:
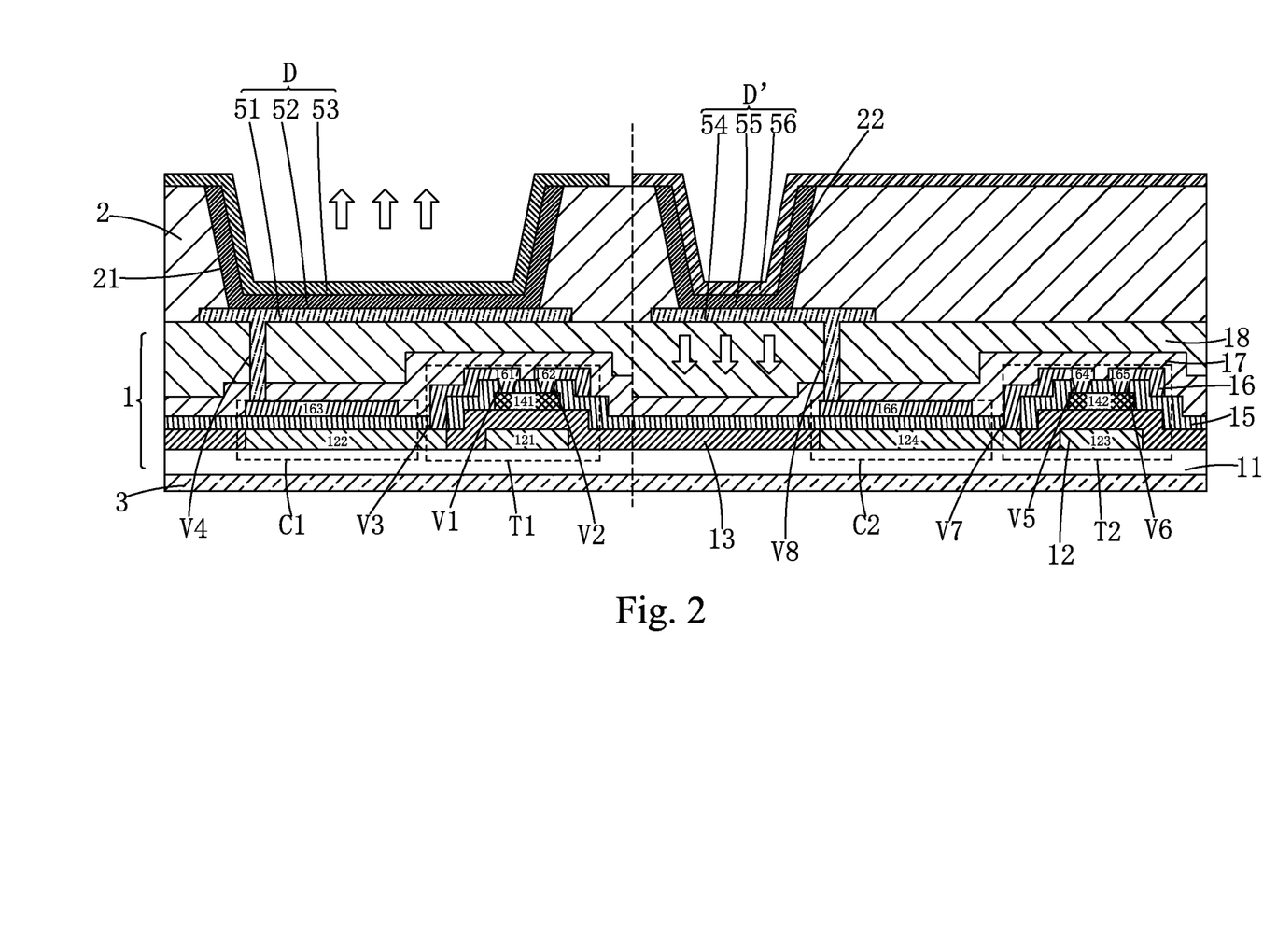
FIG. 2 is a cross-sectional view illustrating a structure of the double-sided OLED display device according to an embodiment of the present invention.

Referring to both FIGS. 1 and 2, the present invention provides a double-sided organic light-emitting diode (OLED) display device, which comprises a plurality of pixels P arranged in an array. Each of the pixels P comprises a plurality of sub-pixels SP that are sequentially arranged. Each of the sub-pixels SP comprises an OLED. The pixels P that are located in one row or the pixels P that are located in a column are collectively defined as a displaying section A, and for two displaying sections A that are adjacent to each other, the OLEDs of all the pixels P of one of the displaying sections A are top-emission OLEDs D, which emit light toward a front side of the OLED display device, while the OLEDs of all the pixels P of the other one of the displaying section A are bottom-emission OLEDs D', which emit light toward a rear side of the OLED display device. The arrangement that the OLEDs of all the pixels P of one displaying section A of two adjacent displaying sections A are set as top-emission OLEDs D, while the OLEDs of all the pixels P of the other displaying section A are set as bottom-emission OLEDs D' allows a user to observe normal displaying of images in two opposite directions associated with the front and rear sides of one OLED display device and there is no need to combine two display devices in a back-to-back manner to provide double-sided displaying so that the application range of the OLED display device can be widened, the amount of space occupied by the double-sided display device can be reduced, and aesthetics of the double-sided display devices can be greatly improved.

FIG. 1 illustrates just one feasible embodiment of the double-sided OLED display device according to the present invention. In the embodiment, the OLEDs of the pixels of the odd columns are provided as top-emission OLEDs D, while the OLEDs of the pixels of the even columns are provided as bottom-emission OLEDs D'.

It is also possible, alternatively, to provide the OLEDs of the pixels of the even columns as top-emission OLEDs D and the OLEDs of the pixels of the odd columns as bottom-emission OLEDs D';

or alternatively, to provide the OLEDs of the pixels of the odd rows as top-emission OLEDs D and the OLEDs of the pixels of the even rows as bottom-emission OLEDs D';

or further alternatively, to provide the OLEDs of the pixels of the even rows as top-emission OLEDs D and the OLEDs of the pixels of the odd rows as bottom-emission OLEDs D'.

Specifically, in the embodiment of FIG. 1, each of the pixels P comprises a red sub-pixel R, a green sub-pixel G, and a blue sub-pixel B that are arranged in sequence. It is also possible to structure each of the pixels P as further or alternatively comprising a white sub-pixel or a yellow sub-pixel.

Specifically, as shown in FIG. 2, the top-emission OLED D comprises a first anode 51, a first OLED emissive layer 52 arranged on the first anode 51, and a transparent cathode 53 set on and covering the first OLED emissive layer 52, wherein the first anode 51 is formed of a material that is preferably a transparent indium tin oxide (ITO) film; the transparent cathode 53 is formed of a material that is a magnesium and silver (Mg—Ag) alloy. The bottom-emission OLED D' comprises a second anode 54, a second OLED emissive layer 55 arranged on the second anode 54, and a non-transparent cathode 56 set on and covering the second OLED emissive layer 55, wherein the second anode 54 is formed of a material that is preferably a transparent ITO film; the non-transparent cathode 56 is formed of a material that is aluminum (Al). Further, a coverage range of the non-transparent cathode 56 is limited to an area in which the sub-pixels SP of the bottom-emission OLED D' are located, while a coverage range of the transparent cathode 53 is generally not limited and may cover an area in which the sub-pixels SP of the top-emission OLED D are located or may further cover the non-transparent cathode 56 in order to reduce resistivity thereof.

Specifically, the double-sided OLED display device according to the present invention further comprises a thin-film transistor (TFT) backplate 1, a pixel definition layer 2 arranged on the TFT backplate 1, and a polarizer 3 attached to an undersurface of the TFT backplate 1.

In the above structure, the pixel definition layer 2 comprises a first pixel definition hole 21 and a second pixel definition hole 22. The top-emission OLED D is received in the first pixel definition hole 21 and arranged on the TFT backplate 1; and the bottom-emission OLED D' is received in the second pixel definition hole 22 and arranged on the TFT backplate 1. A portion of the TFT backplate 1 that corresponds to the second OLED emissive layer 55 is made transparent so as to allow light emitting from the bottom-emission OLED D' to transmit toward the rear side or undersurface of the TFT backplate 1.

The TFT backplate 1 is provided therein with a plurality of TFTs, and the structure of the TFTs is not limited to any specific type and can be for example an etch-stop type, a back channel type, a bottom gate type, or a top gate type. FIG. 2 provides an illustration of an arrangement in which the TFT backplate 1 is provided with TFTs of an etch-stop bottom-gate structure. The TFT backplate 1 comprises:

a backing plate 11;

a first metal layer 12 that is arranged on the backing plate 11 and is patterned, wherein the patterned first metal layer 12 comprises a first gate electrode 121, a first lower electrode plate 122, a second gate electrode 123, and a second lower electrode plate 124 that are spaced from each other;

a gate insulation layer 13 that is arranged on the backing plate 11 and covers the first gate electrode 121 and the second gate electrode 123 and fills up spacing gaps among the first gate electrode 121, the first lower electrode plate 122, the second gate electrode 123, and the second lower electrode plate 124;

a first semiconductor active layer 141 that is arranged on the gate insulation layer 13 and located exactly above the first gate electrode 121;

a second semiconductor active layer 142 that is arranged on the gate insulation layer 13 and located exactly above the second gate electrode 123;

an etch stop layer 15 that is set on and covers the first semiconductor active layer 141, the second semiconductor active layer 142, the gate insulation layer 13, the first lower electrode plate 122, and the second lower electrode plate 124;

a second metal layer 16 that is arranged on the etch stop layer 15 and is patterned, wherein the patterned second metal layer 16 comprises a first source electrode 161, a first drain electrode 162, a first upper electrode plate 163, a second source electrode 164, a second drain electrode 165, and a second upper electrode plate 166 that are spaced from each other;

a protective layer 17 that is set on and covers the second metal layer 16 and the etch stop layer 15; and an organic planarization layer 18 that is set on and covers the protective layer 17.

The first gate electrode 121, the first semiconductor active layer 141, the first source electrode 161, and the first drain electrode 162 collectively form a first drive TFT T1, and the first lower electrode plate 122 and the first upper electrode plate 163 collectively form a first capacitor C1. The first source electrode 161 and the first drain electrode 162 are respectively connected, through a first via V1 and second via V2 that extend through the etch stop layer 15, to two ends of the first semiconductor active layer 141. The first source electrode 161 is further connected, through a third via V3 that extends through the etch stop layer 15, to the first lower electrode plate 122. The first anode 51 is connected, through a fourth via V4 that extends through the organic planarization layer 18 and the protective layer 17, to the first upper electrode plate 163.

The second gate electrode 123, the second semiconductor active layer 142, the second source electrode 164, and the second drain electrode 165 collectively form a second drive TFT T2, and the second lower electrode plate 124 and the second upper electrode plate 166 collectively form a second capacitor C2. The second source electrode 164 and the second drain electrode 165 are respectively connected, through a fifth via V5 and a sixth via V6 that extend through the etch stop layer 15, to two ends of the second semiconductor active layer 142. The second source electrode 164 is further connected, through a seventh via V7 that extends through the etch stop layer 15, to the second lower electrode plate 124. The second anode 54 is connected, through an eighth via V8 that extends through the organic planarization layer 18 and the protective layer 17, to the second upper electrode plate 166.

Further, the polarizer 3 is attached to the undersurface of the backing plate 11 of the TFT backplate 1; the pixel definition layer 2 is arranged on the organic planarization layer 18 of the TFT backplate 1; the second OLED emissive layer 55 of the bottom-emission OLED D' is arranged not to overlap the first metal layer 12 of the TFT backplate 1 and also not to overlap the second metal layer 16 of the TFT backplate 1 in order to ensure the portion of the TFT backplate 1 that corresponds to the second OLED emissive layer 55 is transparent and light-transmitting.

The backing plate 11 is preferably a glass plate.

The gate insulation layer 13, the etch stop layer 15, and the protective layer 17 are each formed of a material that comprises silicon oxide (SiOx), silicon nitride (SiOx), or a stacked combination thereof.

The first semiconductor active layer 141 and the second semiconductor active layer 142 are each formed of a material comprising indium gallium zinc oxide (IGZO).

The organic planarization layer 18 and the pixel definition layer 2 are each formed of a material comprising organic photoresist.

Figure 3:
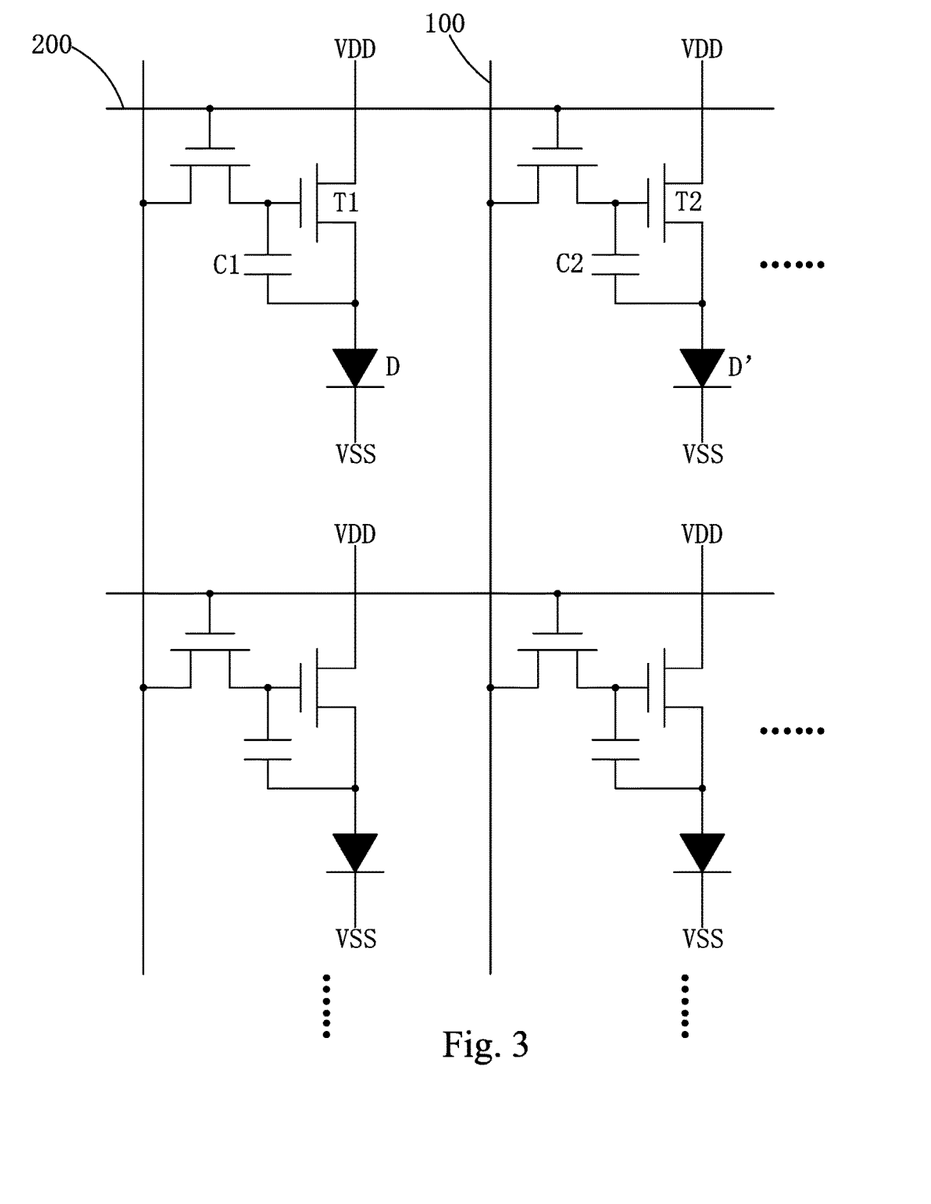
FIG. 3 is a circuit diagram of the double-sided OLED display device according to an embodiment of the present invention.

Referring collectively to FIGS. 1 and 3, in the case that the double-sided OLED display device of the present invention is structured such that the pixels P located in one column is taken as a displaying section A, different drive integrated circuits (ICs, not shown) are necessary to respectively feed data signals to data lines 100 corresponding to the pixels P of the odd columns and data lines 100 corresponding to the pixels P of even columns in order to prevent erroneous displaying.

In the case that the double-sided OLED display device of the present invention is structured such that the pixels P located in one row is taken as a displaying section A, one signal drive IC (not shown) can be used to feed data signals to each of data lines 100; however, the data signals must be made different according to activation time of gate scan lines 200, such that during activation of the gate scan lines 200 of odd rows, the drive IC feeds the data signals necessary for the pixels P of the odd rows to each of the data lines 100 and similarly, during activation of the gate scan lines 200 of even rows, the drive IC feeds the data signals necessary for the pixels P of even rows to each of the data lines 100.

In summary, the present invention provides a double-sided OLED display device, in which two adjacent ones of displaying sections are arranged such that OLEDs of all the pixels located in one of the displaying sections are top-emission OLEDs, while the OLEDs of all the pixels located in another one of the displaying sections are bottom-emission OLEDs. A user is allowed to observe normal displaying of images in two opposite directions associated with the front and rear sides of one OLED display device and there is no need to combine two display devices in a back-to-back manner to provide double-sided displaying so that the application range of the OLED display device can be widened, the amount of space occupied by the double-sided display device can be reduced, and aesthetics of the double-sided display devices can be greatly improved.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A double-sided organic light-emitting diode (OLEM) display device, comprising a plurality of pixels arranged in an array, a thin-film transistor (TFT) backplate, a pixel definition layer arranged on the TFT backplate, and a polarizer attached to an undersurface of the TFT backplate, and the pixel definition layer comprises a first pixel definition hole and a second pixel definition hole, the top-emission (OLED being received in the first pixel definition hole and arranged on the TFT backplate, the bottom-emission OLED being received in the second pixel definition hole and arranged on the TFT backplate; and a portion of the TFT backplate that corresponds to the second OLED emissive layer is transparent and light transmitting, each of the pixels comprising a plurality of sub-pixels that are arranged in sequence, each of the sub-pixels comprising an OLED:
wherein the pixels located in one row of the array or the pixels located in one, column of the array collectively form a displaying section, and for two adjacent ones of the displaying sections, the OLEDs of the pixels of one of the displaying sections are top-emission OLEDs, and the OLEDs of the pixels of the other one of the displaying sections are bottom-emission OLEDs;
wherein the top-emission OLED comprises a first anode, a first OLED emissive layer arranged on the first anode, and a transparent cathode set on and covering the first OLED emissive layer; and
the bottom-emission OLED comprises a second anode, a second OLED emissive layer arranged on the second anode, and a non-transparent cathode set on and covering the second OLED emissive layer.

2. The double-sided OLED display device as claimed in claim 1, wherein the OLEDs of the pixels of odd rows are op-emission OLEDs and the OLEDs of the pixels of even rows are bottom-emission OLEDs.

3. The double-sided OLED display device as claimed in claim 1, wherein the OLEDs of the pixels of even rows are top-emission OLEDs and the OLEDs of the pixels of odd rows are bottom-emission OLEDs.

4. The double-sided OLED display device as claimed in claim 1, wherein the OLEDs of the pixels of odd columns are top-emission (OLEDs and the OLEDs of the pixels of even columns are bottom-emission OLEDs.

5. The double-sided OLED display device as claimed in claim 1, wherein the OLEDs of the pixels of even columns are top-emission OLEDs and the OLEDs of the pixels of odd columns are bottom-emission OLEDs.

6. The double-sided OLED display device as claimed in claim 1, wherein the transparent cathode further covers the non-transparent cathode.

7. The double-sided OLED display device as claimed in claim 1, wherein the TFT backplate comprises:
a backing plate;
a first metal layer that is arranged on the backing plate and is patterned, wherein the patterned first metal layer comprises a first gate electrode, a first lower electrode plate, a second gate electrode, and a second lower electrode plate that are spaced from each other;

a gate insulation layer that is arranged on the backing plate and covers the first gate electrode and the second gate electrode and fills up spacing gaps among the first gate electrode, the first lower electrode plate, the second gate electrode, and the second lower electrode plate;

a first semiconductor active layer that is arranged on the gate insulation layer and located exactly above the first gate electrode;

a second semiconductor active layer that is arranged on the gate insulation layer and located exactly above the second gate electrode;

an etch stop layer that is set on and covers the first semiconductor active layer the second semiconductor active layer the gate insulation layer the first lower electrode plate, and the second lower electrode plate;

a second metal layer that is arranged on the etch stop layer and is patterned, wherein the patterned second metal layer comprises a first source electrode, a first drain electrode, a first upper electrode plate, a second source electrode, a second drain electrode, and a second upper electrode plate that are spaced from each other;

a protective layer that is set on and covers the second metal layer and the etch stop layer; and an organic platinization layer that is set on and covers the protective layer, wherein the first gate electrode, the first semiconductor active layer, the first source electrode, and the first drain electrode collectively form a first drive TFT, and the first lower electrode plate and the first upper electrode plate collectively form a first capacitor; the first source electrode and the first drain electrode are respectively connected, through a first via and second via that extend through the etch stop layer, to two ends of the first semiconductor active layer and he first source electrode is further connected, through a third via that extends through the etch stop layer, to the first lower electrode plate; and the first anode is connected, through a fourth via that extends through the organic planarization layer and the protective layer, to the first upper electrode plate; and the second gate electrode, the second semiconductor active layer, the second source electrode, and the second drian electrode collectively form a second drive TFT, and the second lower electrode plate and the second upper electrode plate collectively form a second capacitor, the second source electrode and the second drain electrode are respectively connected, through a fifth via and a sixth via that extend through the etch stop layer, to two ends of the second semiconductor active layer and the second source electrode is further connected, through a seventh via that extends through the etch stop layer, to the second lower electrode plate; and the second anode is connected, through an eighth via that extends through the organic planarization layer and the protective layer, to the second upper electrode plate.

8. The double-sided OLED display device as claimed in claim 1, wherein the first anode and the second anode are each formed of a material comprising indium tin oxides; the transparent cathode is formed of a material comprising a magnesium and silver alloy and the non-transparent cathode is formed of a material comprising aluminum.

9. A double-sided organic light-emitting diode (OLED) display device, comprising a plurality of pixels arranged in an array, each of the pixels comprising a plurality of sub-pixels that are arranged in sequence, each of the sub-pixels comprising an OLED;

wherein the pixels located in one row of the array or the pixels located in one column of the array collectively form a displaying section, and for two adjacent ones of the displaying sections, the OLEDs of the pixels of one of the displaying sections are top-emission OLEDs, and the OLEDs of the pixels of the other one of the displaying sections are bottom-emission OLEDs;

wherein the top-emission OLED comprises a first anode, a first OLED emissive layer arranged on the first anode, and a transparent cathode set on and covering the first OLED emissive layer; and the bottom-emission OLED comprises a second anode, a second OLED emissive layer arranged on the second anode, and a non-transparent cathode set on and covering the second OLED emissive layer;

and further comprising a thin-film transistor (TFT) backplate, a pixel definition layer arranged on the TFT backplate, and a polarizer attached to an undersurface of the TET backplate; and the pixel definition layer comprises a first pixel definition hole and a second pixel definition hole, the top-emission OLED being received in the first pixel definition hole and arranged on the TFT backplate, the bottom-emission OLED being received in the second pixel definition hole and arranged on the TFT backplate; and a portion of the TFT backplate that to the second OLED emissive layer is transparent and light transmitting.

10. The double-sided OLED display device as claimed in claim 9, wherein the OLEDs of the pixels of odd rows are top-emission OLEDs and the OLEDs of the pixels of even rows are bottom-emission OLEDs.

11. The double-sided OLED display device as claimed in claim 9, wherein the OLEDs of the pixels of even rows are top-emission OLEDs and the OLEDs of the pixels of odd rows are bottom-emission OLEDs.

12. The double-sided OLED display device as claimed in claim 9, wherein the OLEDs of the pixels of odd columns are top-emission OLEDs and the OLEDs of the pixels of even columns are bottom-emission OLEDs.

13. The double-sided OLED display device as claimed in claim 9, wherein the OLEDs of the pixels of even columns are top-emission OLEDs and the OLEDs of the pixels of odd columns are bottom-emission OLEDs.

14. The double-sided OLED display device as claimed in claim 9, wherein the transparent cathode further covers the non-transparent cathode.

15. The double-sided OLED display device as claimed in claim 9, wherein the TFT backplate comprises:

a backing plate;

a first metal layer that is arranged on the backing plate and is patterned, wherein the patterned first metal layer comprises a first gate electrode, a first lower electrode plate, a second gate electrode, and a second lower electrode plate that are spaced from each other;

a gate insulation layer that is arranged on the backing plate and covers the first gate electrode and the second gate electrode and fills up spacing gaps among the first gate electrode, the first lower electrode plate, the second gate electrode, and the second lower electrode plate;

a first semiconductor active layer that is arranged on the gate insulation layer and located exactly above the first gate electrode;

a second semiconductor active layer that is arranged on the gate insulation layer and located exactly above the second gate electrode;

an etch stop layer that is set on and covers the first semiconductor active layer the second semiconductor active layer the gate insulation layer the first lower electrode plate, and the second lower electrode plate;

a second metal layer that is arranged on the etch stop layer and is patterned, wherein the patterned second metal layer comprises a first source electrode, a first drain electrode, a first upper electrode plate, a second source electrode, a second drain electrode, and a second upper electrode plate that are spaced from each other;

a protective layer that is set on and covers the second metal layer and the etch stop layer; and an organic planarization layer that is set on and covers the protective layer, wherein the first gate electrode, the first semiconductor active layer, the first source electrode, and the first drain electrode collectively form a first drive TFT, and the first lower electrode plate and the first upper electrode plate collectively form a first capacitor; the first source electrode and the first drain electrode are respectively connected, through a first via and second via that extend through the etch stop layer, to two ends of the first semiconductor active layer and he first source electrode is further connected, through a third via that extends through the etch stop layer, to the first lower electrode plate; and the first anode is connected, through a fourth via that extends through the organic planarization layer and the protective layer, to the first upper electrode plate; and the second gate electrode, the second semiconductor active layer, the second source electrode, and the second drain electrode collectively form a second drive TFT, and the second lower electrode plate and the second upper electrode plate collectively form a second capacitor, the second source electrode and the second drain electrode are respectively connected, through a fifth via and a sixth via that extend through the etch stop layer, to two ends of the second semiconductor active layer and the second source electrode is further connected, through a seventh via that extends through the etch stop layer, to the second lower electrode plate; and the second anode is connected, through an eighth via that extends through the organic planarization layer and the protective layer, to the second upper electrode plate.

16. The double-sided OLED display device as claimed in claim 9, wherein the first anode and the second anode are each formed of a material comprising indium tin oxides; the transparent cathode is formed of a material comprising a magnesium and silver alloy and the non-transparent cathode is formed of a material comprising aluminum.

* * * * *